United States Patent
Nguyen et al.

(10) Patent No.: US 7,444,560 B2
(45) Date of Patent: Oct. 28, 2008

(54) TEST CLOCKING SCHEME

(75) Inventors: Thai M. Nguyen, San Jose, CA (US); William Shen, San Jose, CA (US); Cam Lu, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 116 days.

(21) Appl. No.: 10/975,315

(22) Filed: Oct. 28, 2004

(65) Prior Publication Data
US 2006/0095816 A1   May 4, 2006

(51) Int. Cl.
G11C 29/00 (2006.01)
G11C 7/00 (2006.01)
G01R 31/28 (2006.01)

(52) U.S. Cl. .................. 714/718; 714/731; 714/744; 365/201

(58) Field of Classification Search ............. 714/718, 714/731, 744; 365/201
See application file for complete search history.

(56) References Cited

U.S. PATENT DOCUMENTS

| 5,689,517 A * | 11/1997 | Ruparel ........... 714/731 |
| 6,539,497 B2 * | 3/2003 | Swoboda et al. ..... 714/726 |
| 6,988,207 B2 * | 1/2006 | Chan et al. .......... 375/224 |
| 7,216,274 B2 * | 5/2007 | Jaber et al. ......... 714/726 |
| 2002/0087928 A1 * | 7/2002 | Six ................ 714/726 |
| 2003/0188243 A1 * | 10/2003 | Rajan .............. 714/731 |
| 2005/0166104 A1 * | 7/2005 | Rich et al. ......... 714/724 |
| 2006/0085707 A1 * | 4/2006 | Khan et al. ........ 714/726 |

FOREIGN PATENT DOCUMENTS

JP          2004286540 A       * 10/2004

OTHER PUBLICATIONS

"Independent clocks for peripheral modules in system-on-chip design" by Watn et al. This paper appears in: SOC Conference, 2003. Proceedings. IEEE International [Systems-on-Chip] Publication Date: Sep. 17-20, 2003 On pp. 25-28 ISBN: 0-7803-8182-3 INSPEC Accession No. 7823551.*

* cited by examiner

Primary Examiner—Cynthia Britt
(74) Attorney, Agent, or Firm—Trexler Bushnell Giangiorgi & Blackstone Ltd.

(57) ABSTRACT

A test clocking scheme that separates the clock driving the functional logic and the memory from the clock driving the test logic and the memory. In other words, the test clocking scheme separates the memory functional clock from the memory test clock into two clock paths. The test clocking scheme provides for the ability to separately shut off either the memory functional clock source or the memory test clock source, provides that less power is required during production testing, and provides that simulation time is reduced during design verification because the functional logic is not clocked.

15 Claims, 21 Drawing Sheets

| Operation | LSI_SCAN_MODE | LSI_SLOW_BISR_CLK_SEL | LSI_AT_SPEED_BIST_CLOCK_SEL_1,0 | PWR_SELECT | |
|---|---|---|---|---|---|
| Factory bist/bisr | 1 | 0 | 00 | 0 | Select bist Test Clock, Shut Off System Clock at Shared Pin |
| Scan | 1 | 0 | 00 | 0 | Select bist Logic Scan Clock Select bist Func Logic Scan Clock |
| Functional | 0 | 0 | 00 | 0 | Select Fast System Clock, Shut off Shared Bist/System Clocks |
| Factory Fuse Scan | 1 | 1 | 00 | 0 | Select Slow System Clock. Select System Clock at Shared Pin. |
| Field bisr | X | X | 00 | 1 | Poweron Sm to Select Slow System Clock |
| At Speed Field bist | 0 | 0 | 11/01 | 0 | Select At-speed Field bist Clock, Func Clock Off or On |

FIG. 7

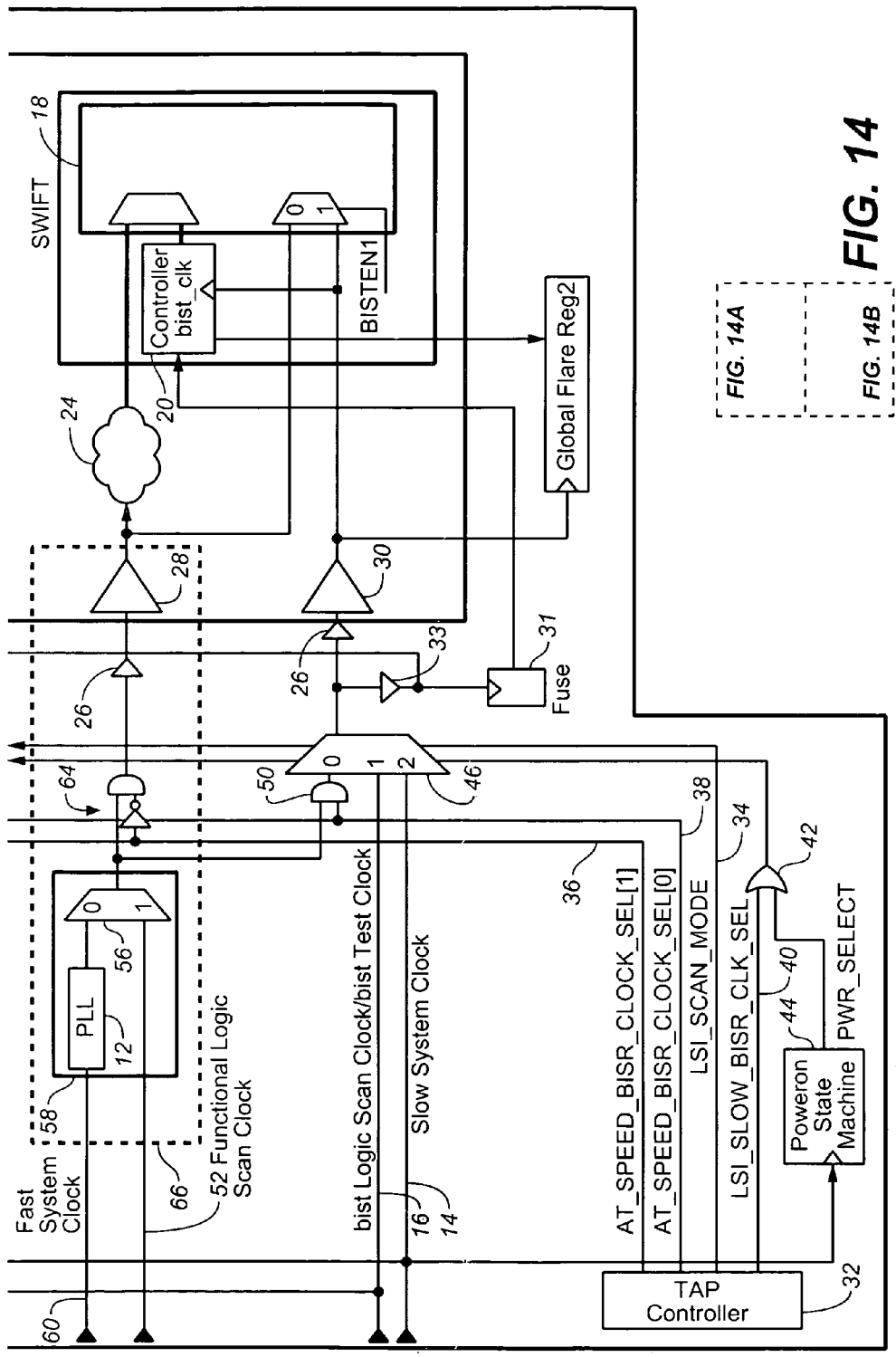

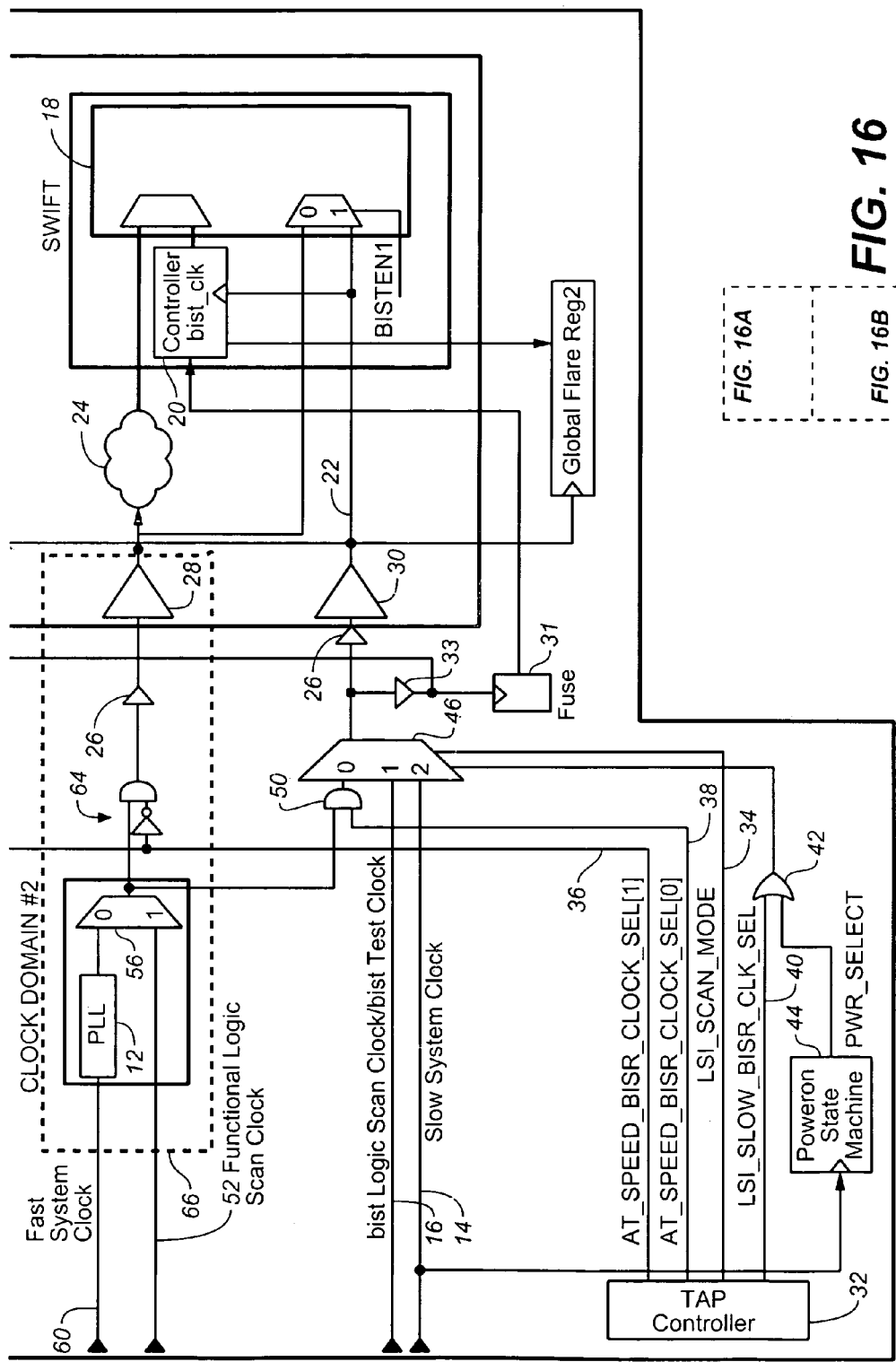

TEST CLOCKING SCHEME

BACKGROUND

The present invention generally relates to test clocking schemes, and more specifically relates to a test clocking scheme wherein the memory functional clock is separated from the memory test clock (i.e., two separate clock paths are provided).

With ever-increasing levels of integration, the number of memories and cores used in a design is getting large along with the amount of logic in the rest of the design. Testing these memories and cores means supplying lots of current to the entire chip, often more than the chip is designed to handle in functional mode due to the nature of these tests and the extra logic added for test. Conversely, in functional mode, the chip may be over-burdened by the power requirement of the extra test logic.

While designing the chip, the chip designer may not consider power issues for test, as he is more interested in power issues related to in-system use. Oftentimes, the designer will design the chip such that portions of the chip effectively cut off in certain modes during system use to save power. However, typically power to test logic is not shut off for system use. Furthermore, oftentimes too much power is required for test with both test logic and functional logic powered up.

OBJECTS AND SUMMARY

An object of an embodiment of the present invention is to provide a test clocking scheme which provides for the ability to separately shut off either the memory functional clock source or the memory test clock source.

Another object of an embodiment of the present invention is to provide a test clocking scheme which provides that less power is required during production testing.

Yet another object of an embodiment of the present invention is to provide a test clocking scheme which provides that simulation time is reduced during design verification because the functional logic is not clocked.

Another object of an embodiment of the present invention is to provide a clock scheme that drives the core clock pin directly for test bypasses the functional clock pin regardless of the source of clock. In other words, the core clock source is brought directly from the source, bypassing the functional clock.

Another object of an embodiment of the present invention is to provide a clock scheme where the clock is driven by a phase locked loon (PLL) or a dedicated pin.

Another object of an embodiment of the present invention is to provide a clock scheme where the clock is driven by functional logic in the hybrid circuit modules (HCM).

Another object of an embodiment of the present invention is to provide a clock scheme where the clocks are driven by logic in the coreware.

Briefly, and in accordance with at least one of the foregoing objects, an embodiment of the present invention provides a test clocking scheme that separates the clock driving the functional logic and the memory from the clock driving the test logic and the memory. In other words, the test clocking scheme separates the memory functional clock from the memory test clock into two clock paths.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 7 is a table which shows values associated with the different modes of operation of the circuit shown in FIG. 1;

DESCRIPTION

Figure 1:
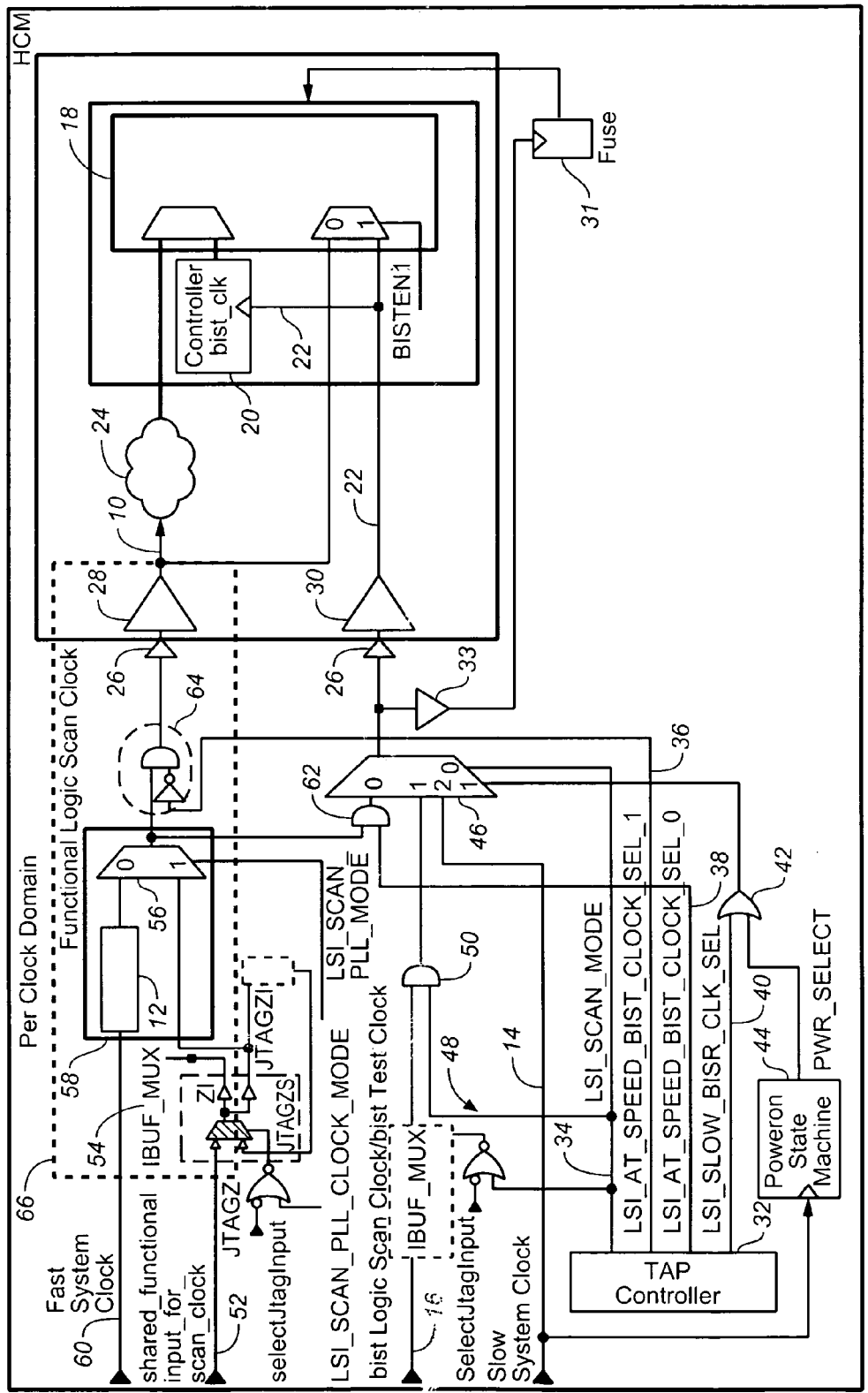
FIG. 1 provides a circuit diagram wherein the functional memory clock is from a PLL, and there is a built-in self repair (BISR) and built-in self test (BIST) clock source.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Illustrated in the Figures are different embodiments of the present invention. Each of the circuits which are shown in the Figures includes a test clocking scheme that separates the clock driving the functional logic and the memory from the clock driving the test logic and the memory. In other words, the test clocking scheme separates the memory functional clock from the memory test clock into two clock paths. The test clocking scheme provides for the ability to separately shut off either the memory functional clock source or the memory test clock source, provides that less power is required during production testing, and provides that simulation time is reduced during design verification because the functional logic is not clocked.

FIG. 1 provides a circuit diagram wherein the functional memory clock 10 is ultimately from a PLL 12, and there is both a BISR clock source 14 ("slow system clock") and a BIST clock source 16 ("bist logic scan_clock/bist test clock"). In FIG. 1, reference numeral 18 identifies RAM, reference numeral 20 identifies a BIST controller which receives a test memory clock 22, and reference numeral 24 identifies a bubble which represents functional logic. It is assumed that the clock driver is manually inserted either in the HTM or HCM.

Clock tree synthesis starts at the points identified with reference numeral 26, with reference numeral 28 identifying a clock tree relating to the functional memory clock 10 and reference numeral 30 identifying a clock tree relating to the test memory clock 22. While reference numeral 31 identifies a fuse and reference numeral 33 identifies a fuse isolator buffer, the fuse clock is not a branch on the clock tree 30.

Reference numeral 32 identifies a TAP controller which provides several outputs 34 ("LSI_SCAN_MODE"), 36 ("LSI_AT_SPEED_BIST_CLOCK_SEL_1"), 38 ("LSI_AT_SPEED_BIST_CLOCK_SEL_0"), and 40 ("LSI_SLOW_BISR_CLK_SEL"). Output 40 ("LSI_SLOW_BISR_CLK_SEL") is provided to an OR gate 42. Also provided to the OR gate 42 is an output ("PWR_SELECT") from a power on state machine 44. The BISR clock source 14 ("slow system clock") is provided to the power on state machine 44. The output of the OR gate 42 is connected to a multiplexer 46, as is output 34 ("LSI_SCAN_MODE") from the TAP controller 32. The BISR clock source 14 ("slow system clock") is also provided to the multiplexer 46.

BIST clock source 16 ("bist logic scan_clock/bist test clock") is provided to JTAG logic 48 and an output therefrom is provided to an AND gate 50 which also receives output 34 ("LSI_SCAN_MODE") from the TAP controller 32. An output from the AND gate 50 is provided to multiplexer 46. Clock 52 ("shared_functional_input_for_scan_clock") is provided to JTAG logic 54 which is connected to a multiplexer 56 on the PLL wrapper 58. Clock 60 ("fast system clock") is provided to the PLL 12. An output of the multiplexer 56 is provided to the clock tree 28 associated with the functional memory clock 10, while an output of multiplexer 46 is provided to clock tree 30 associated with the test memory clock 22. The output of the multiplexer 56 is also provided to an AND gate 62 along with output 38 ("LSI_AT_SPEED_BIST_CLOCK_SEL_0") of the TAP controller 32. Logic 64 is optional. Rectangle 66 identifies structure associated with the functional logic scan clock. Such structure is preferably provided per clock domain.

As identified in FIG. 1, a separate clock tree is provided each of the functional clock and the test clock. Hence, the clocks can be shut off independently of each other to save power. By so doing, scan ATPG can use "capture-by-domain" as opposed to having to balance the insertion delay between the two clocks because the functional logic effectively talks to the bist logic during scan.

Figure 2:
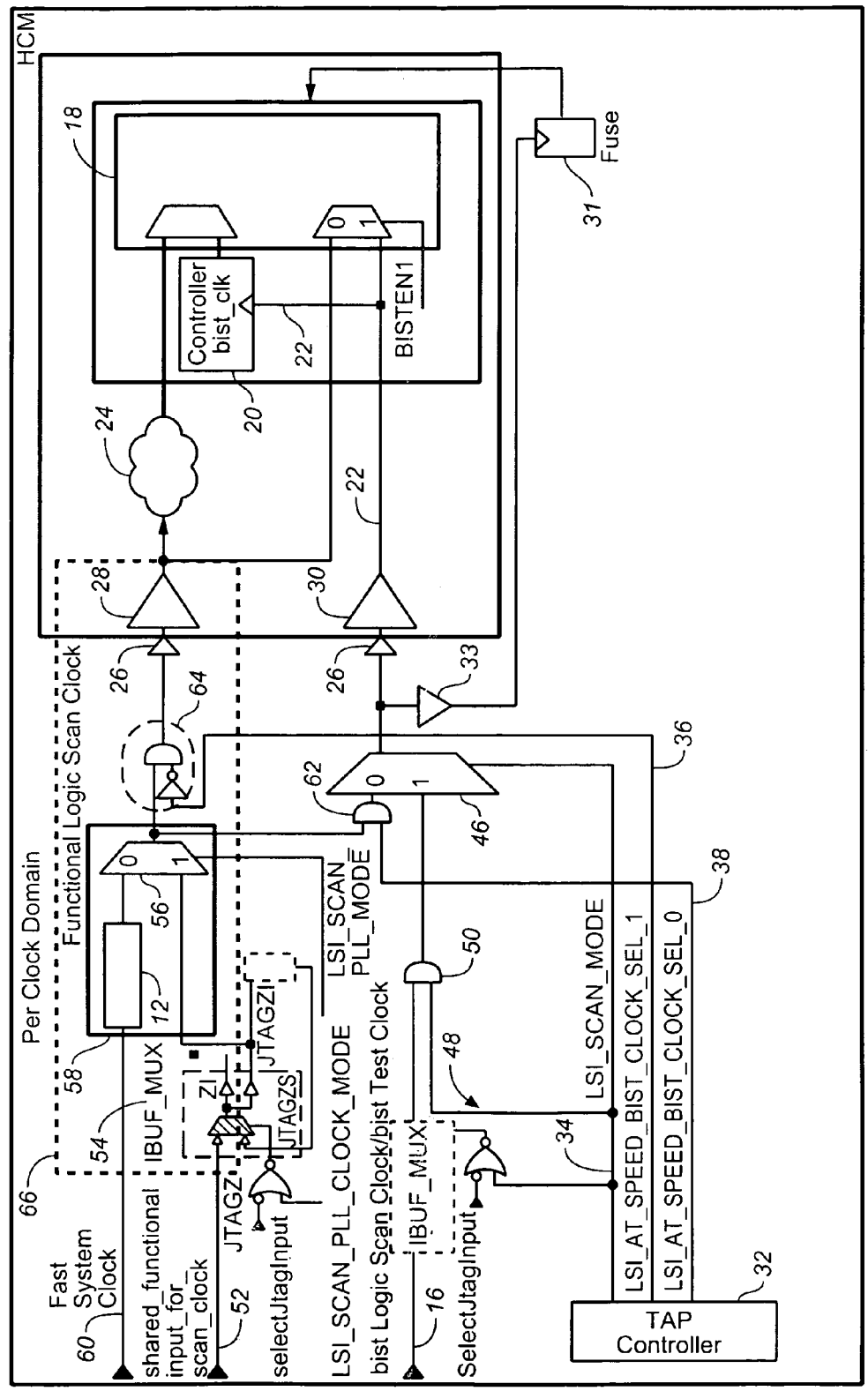
FIG. 2 is similar to FIG. 1, but wherein there is only a BIST controller.

FIGS. 2-6 illustrate circuits which are similar to that which is shown in FIG. 1. Hence, like reference numerals are used to identify like parts. FIG. 2 is similar to FIG. 1, but wherein there is only a BIST controller 20 and there is no BISR logic provided. The BIST clock source multiplexer 46a is a 2 to 1 multiplexer only.

Figure 3:
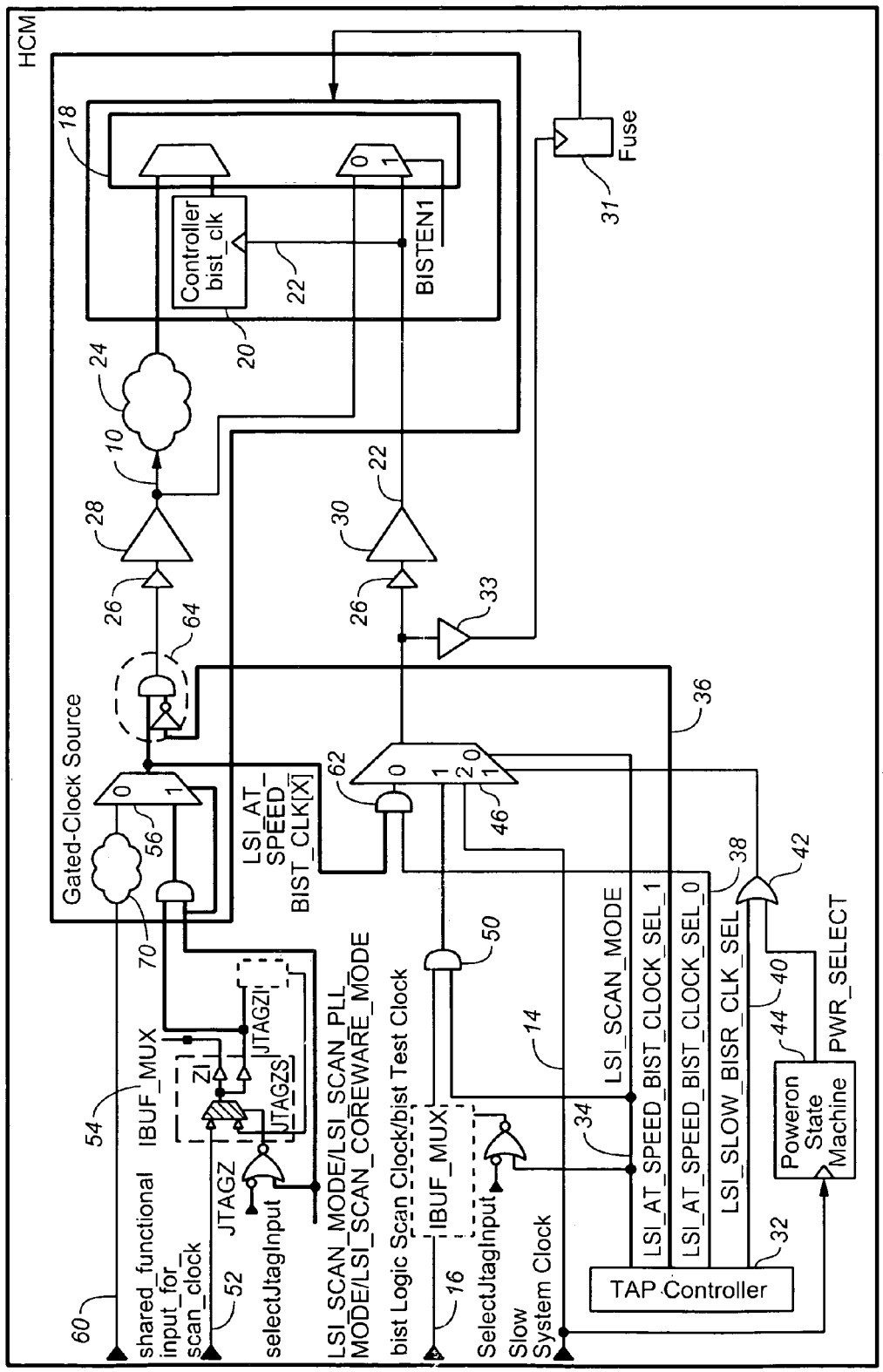
FIG. 3 provides a circuit diagram wherein the functional memory clock is generated within HCM, and there is a BISR and BIST clock source.
Figure 4:
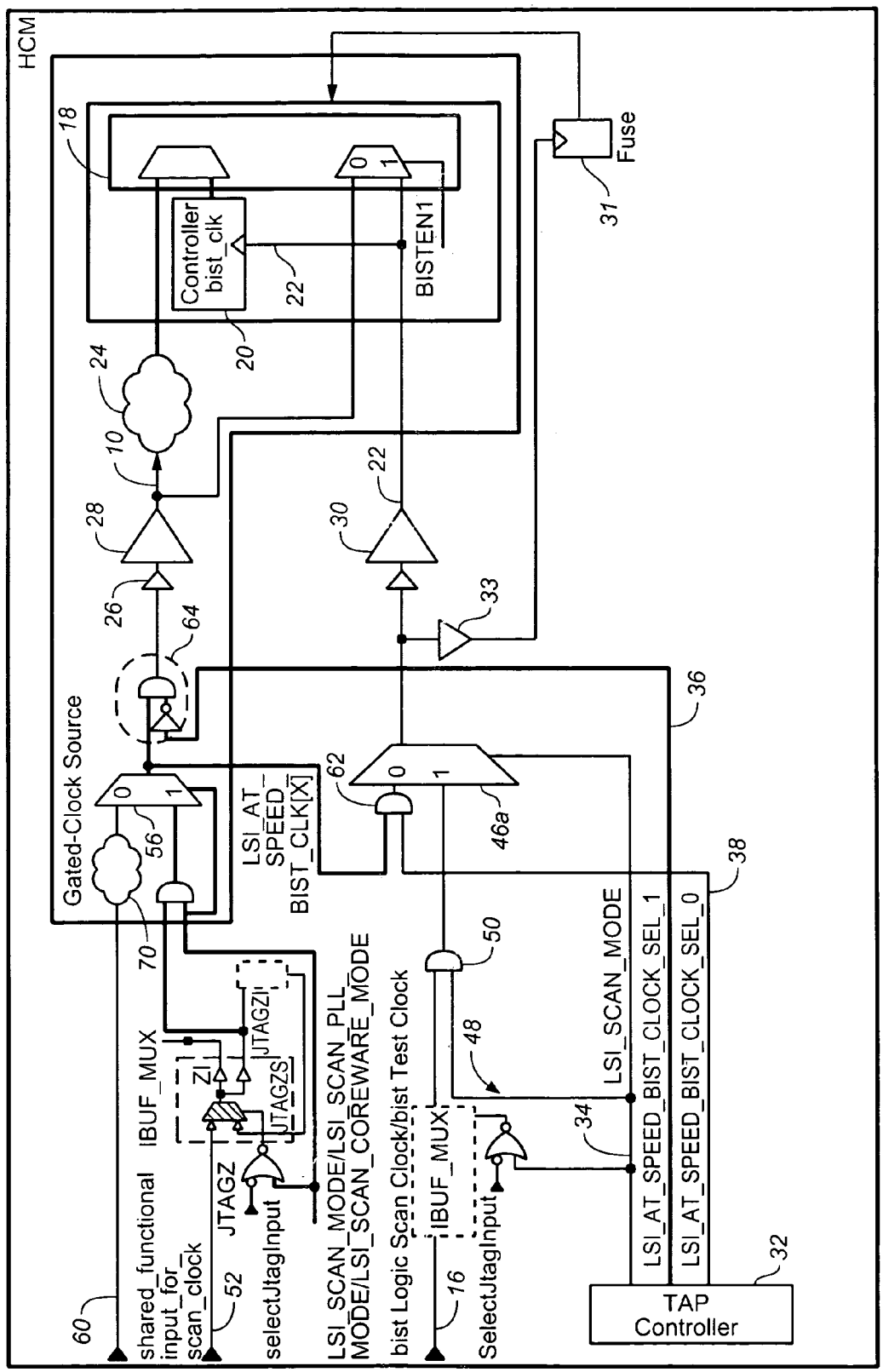
FIG. 4 is similar to FIG. 3, but wherein there is only a BIST controller.
Figure 5:
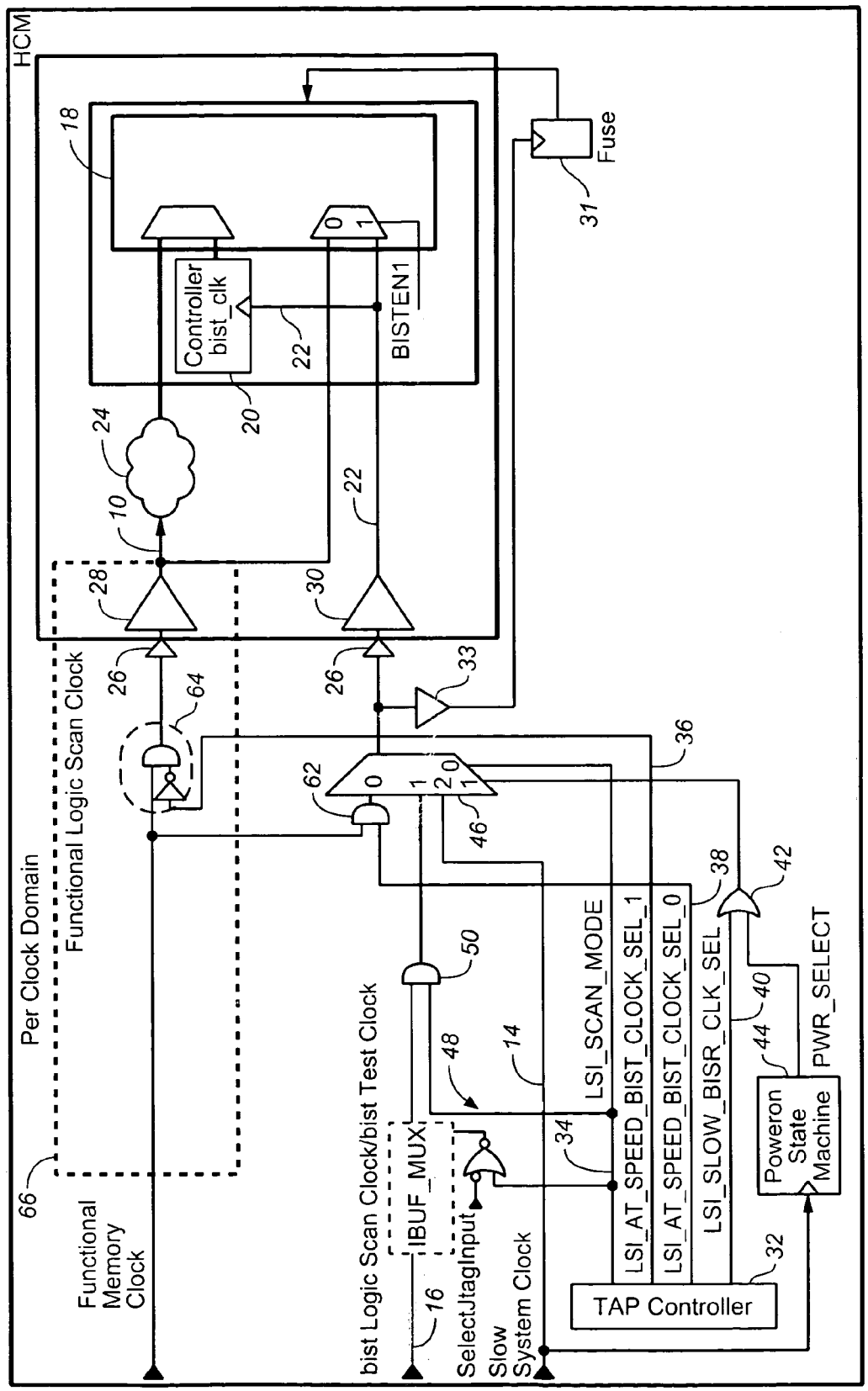
FIG. 5 provides a circuit diagram wherein the functional memory clock is directly driven from a chip pin, and there is a BISR and BIST clock source.
Figure 6:
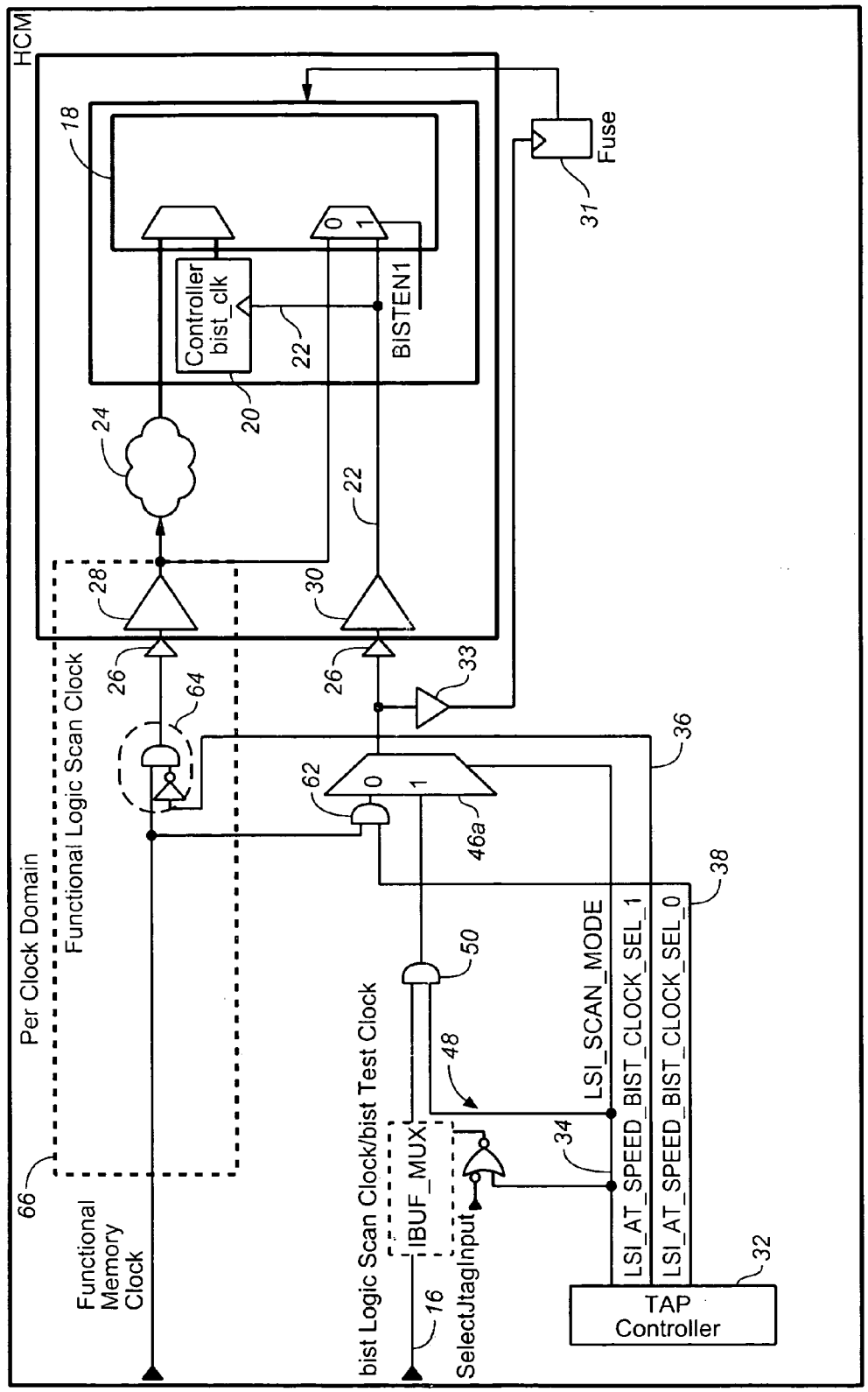
FIG. 6 is similar to FIG. 5, but wherein there is only a BIST controller.
Figure 8:
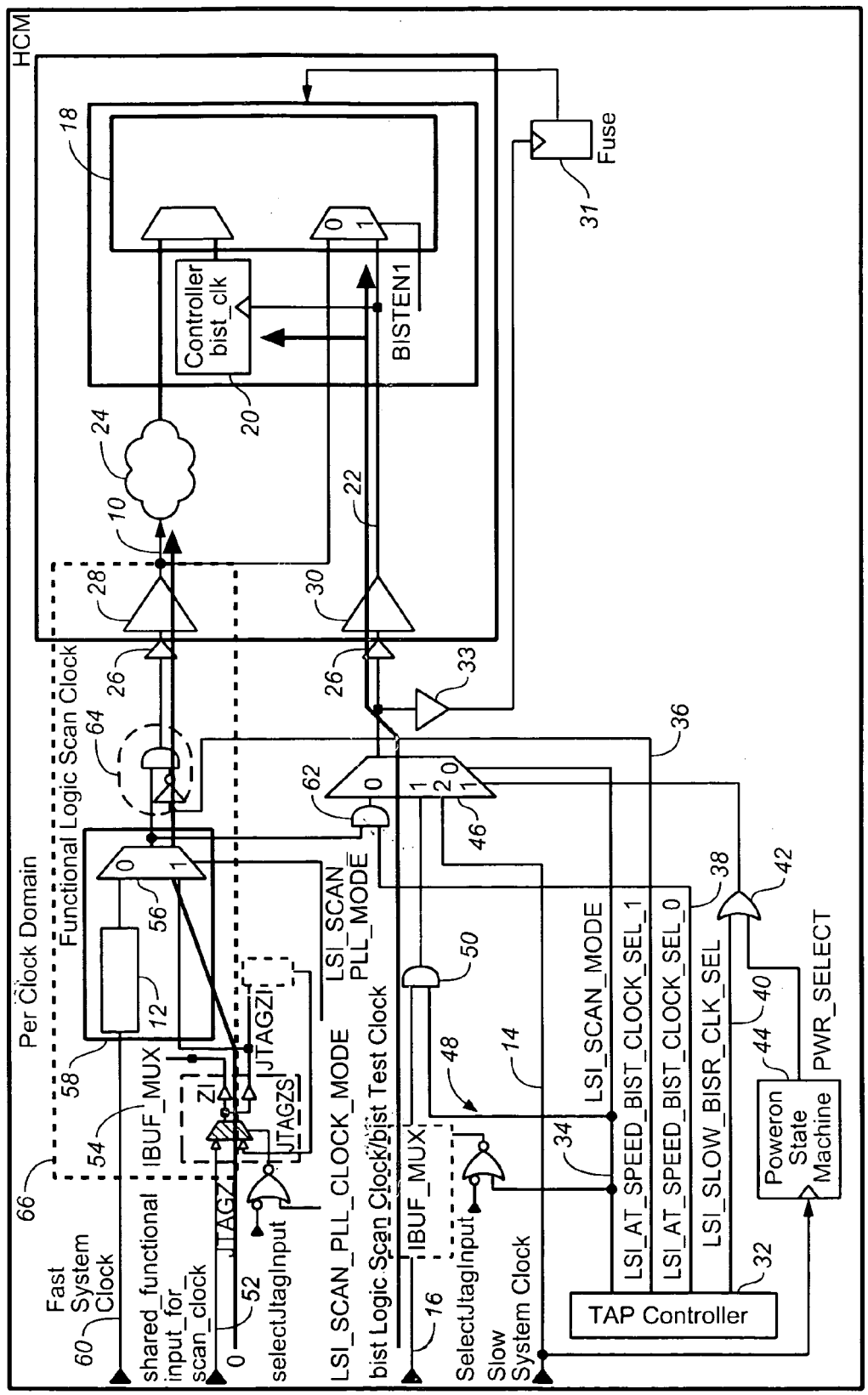
FIGS. 8-13 provide a set of figures which identifies which clock source is used for each mode of operation, as identified in the table provided in FIG. 7.
Figure 9:
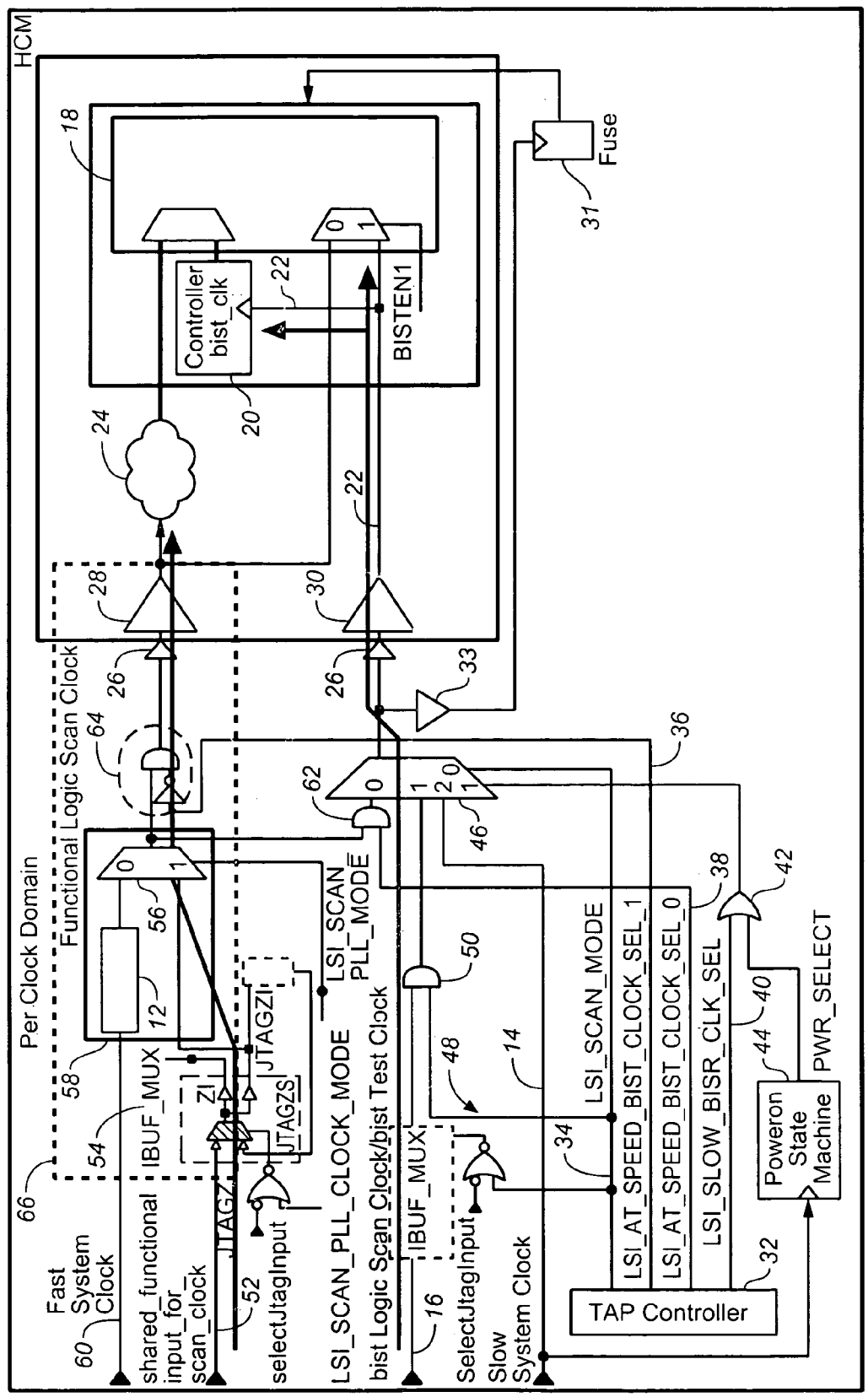
Figure 10:
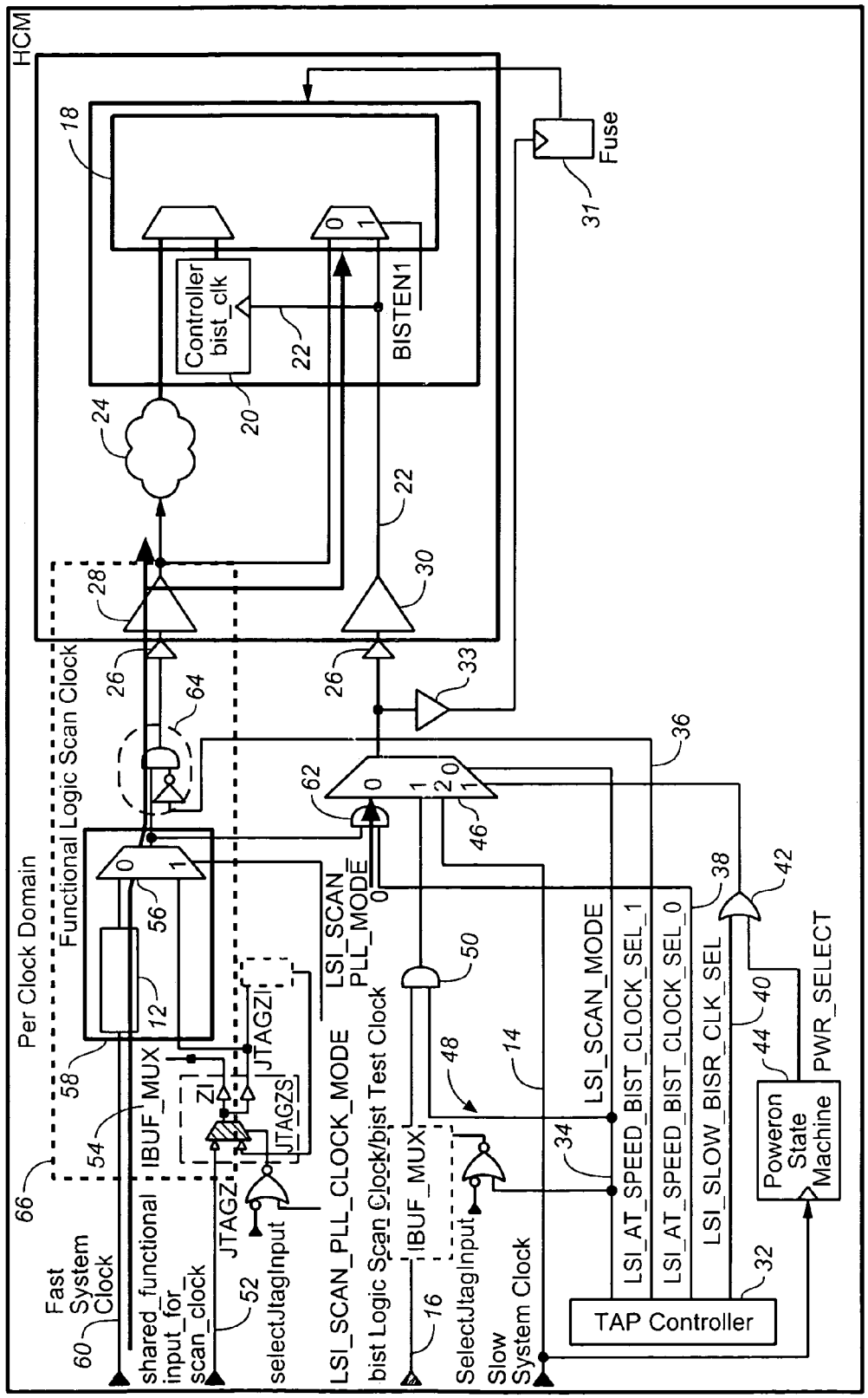
Figure 11:
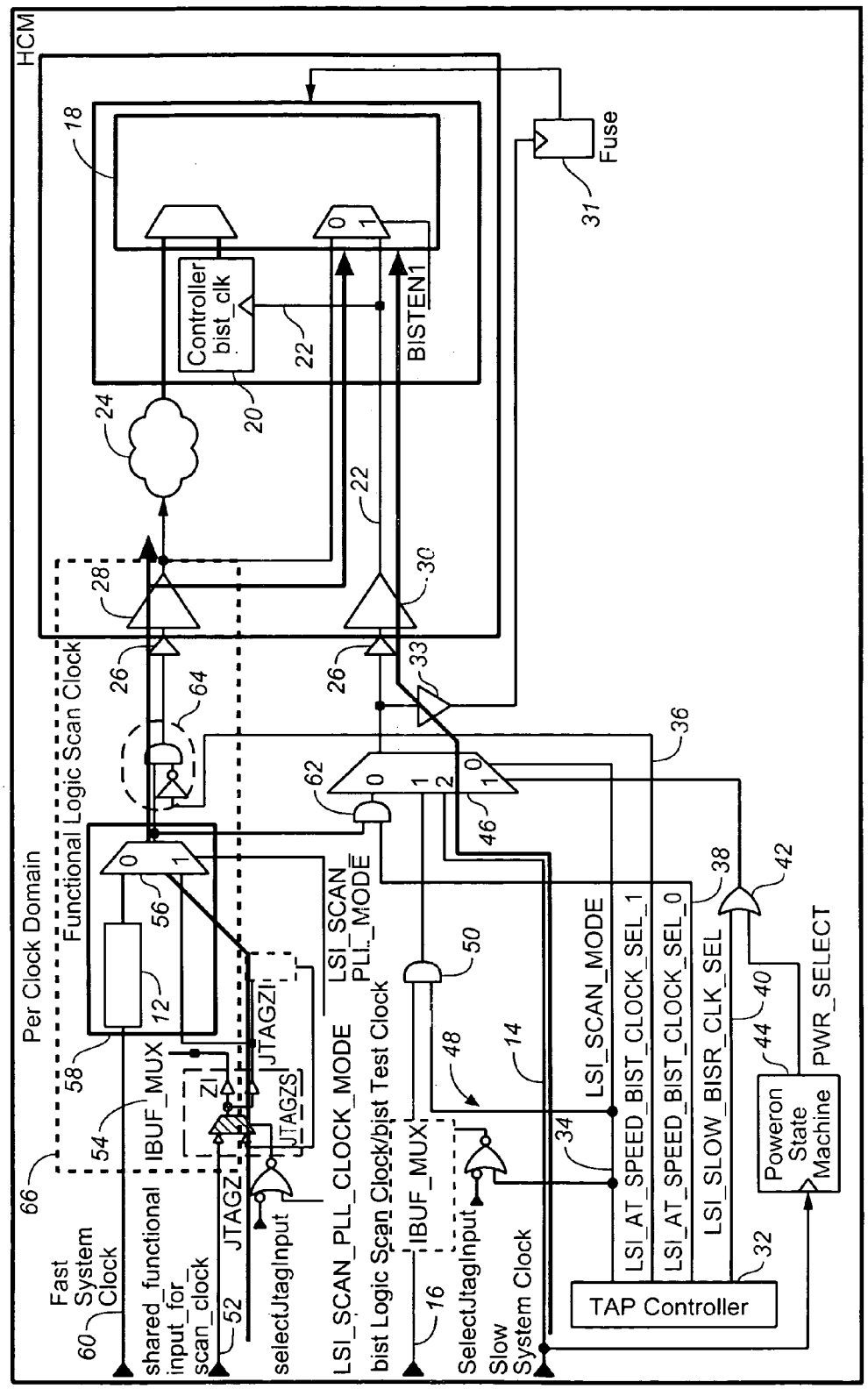
Figure 12:
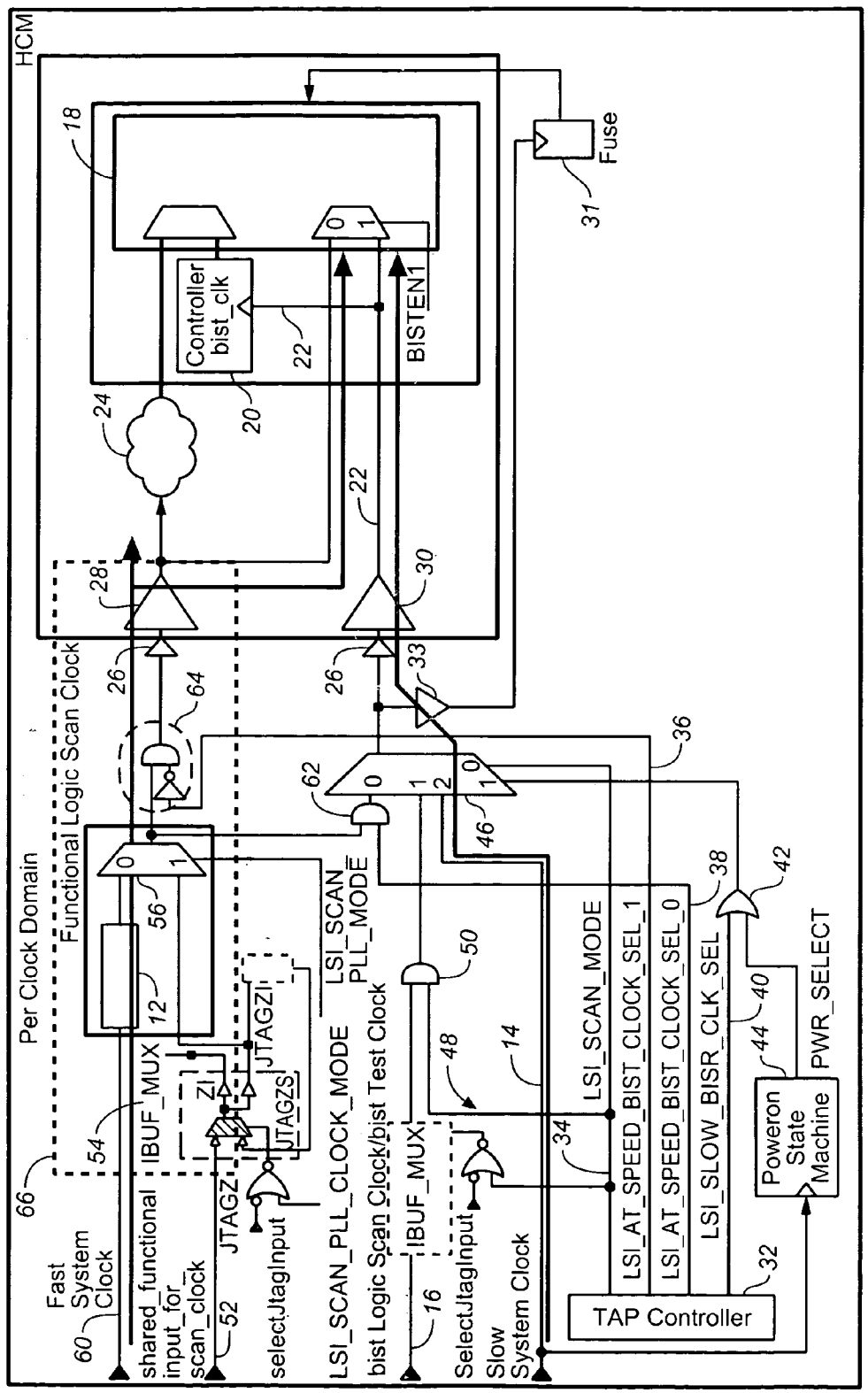
Figure 13:
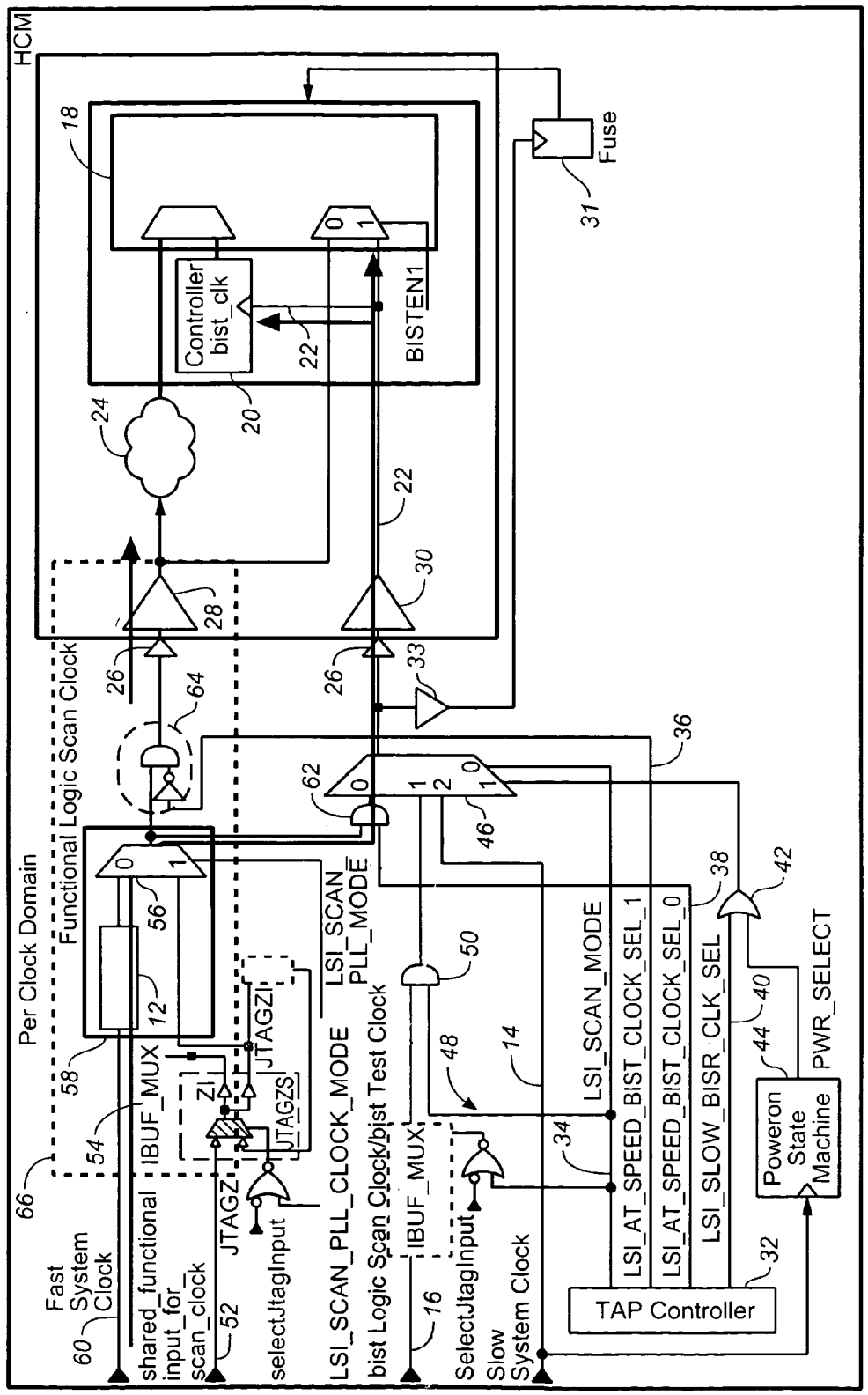

FIG. 3 provides a circuit diagram wherein the functional memory clock 10 is generated within HCM using logic 70, and there is a BISR and BIST clock source. FIG. 4 is similar to FIG. 3, but wherein there is only a BIST controller 20 and BIST clock source multiplexer 46a is a 2 to 1 multiplexer only. FIG. 5 provides a circuit diagram wherein the functional memory clock is directly driven from a chip pin. The pin may be a dedicated clock pin or the clock can be provided from another chip on the board or off the board from a computer, for example. The buffer must be input only. At-speed field BIST is supported but requires that the TAP controller 32 be controlled to select the clock source and monitor BIST pass/fail status. In the circuit shown in FIG. 4, and there is a BISR and BIST clock source. FIG. 6 is similar to FIG. 5, but wherein there is only a BIST controller 20 and BIST clock source multiplexer 46a is a 2 to 1 multiplexer only.

FIG. 7 is a table which shows values associated with the different modes of operation of the circuit shown in FIG. 1. FIGS. 8-13 provide a set of figures which identifies which clock source is used for each mode of operation, as identified in the table provided in FIG. 7. Specifically, FIG. 8 relates to the "factory bist/bisr" operation, FIG. 9 relates to the "scan" operation, FIG. 10 relates to the "functional" operation, FIG. 11 relates to the "factory fuse scan" operation, FIG. 12 relates to the "field bisr" operation, and FIG. 13 relates to the "at speed field bist" operation.

Figure 14A:
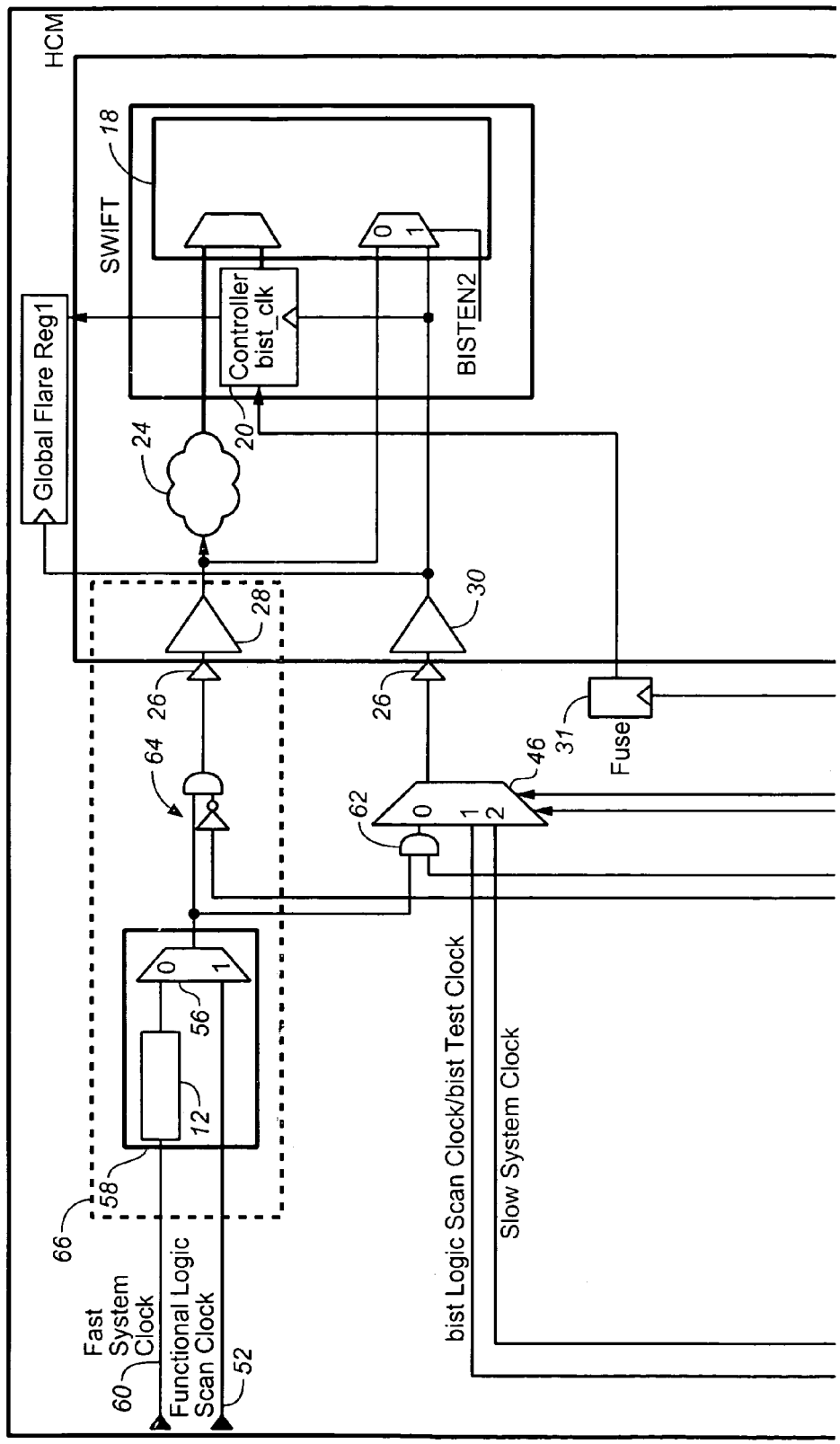
FIG. 14 is a circuit diagram which shows a separate BIST clock tree for each memory clock domain for at-speed BIST.
Figure 15A:
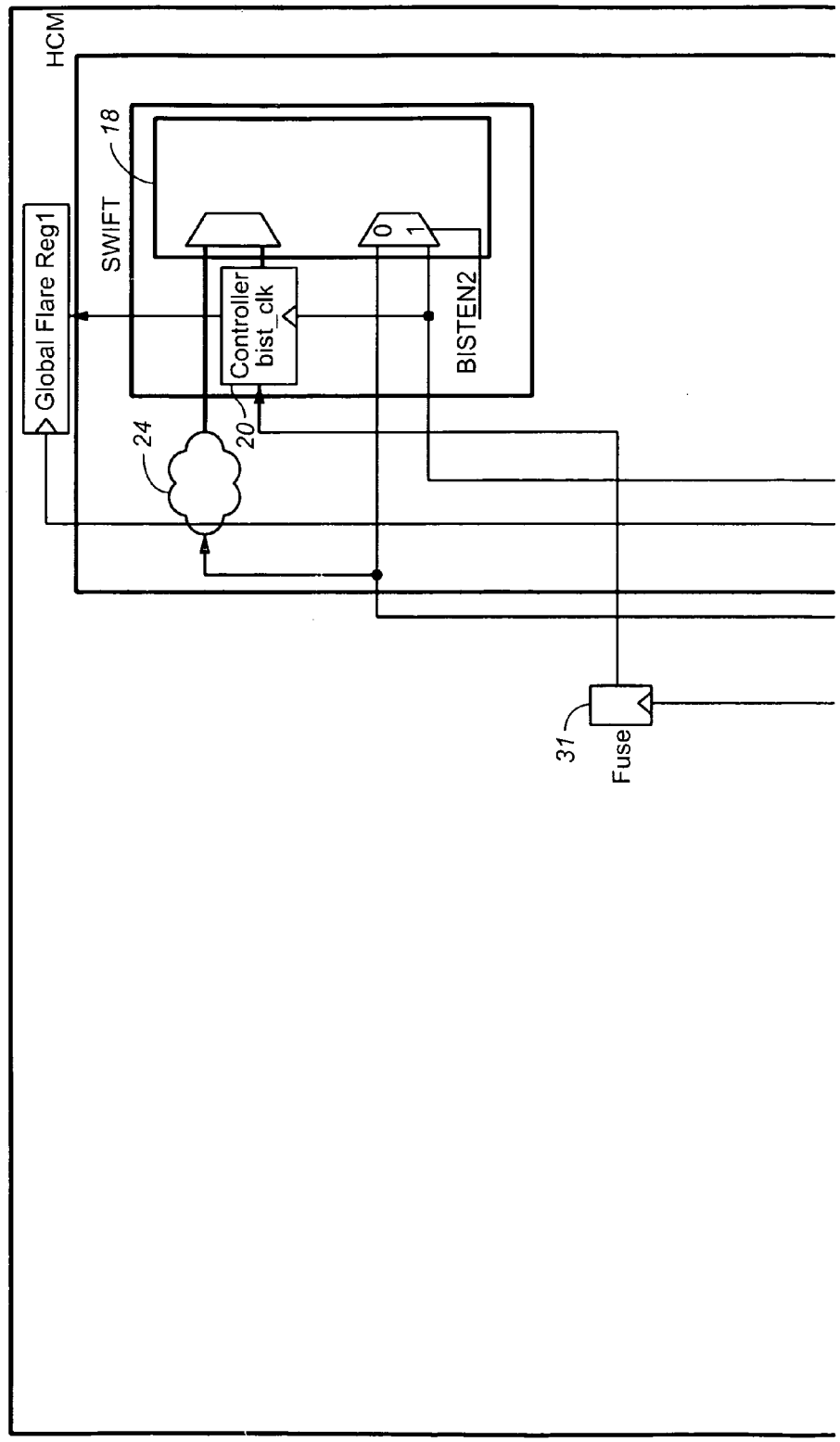
FIG. 15 is a circuit diagram which shows memories in the same clock domain sharing the same clock trees.
Figures 15, 15A, 15B:
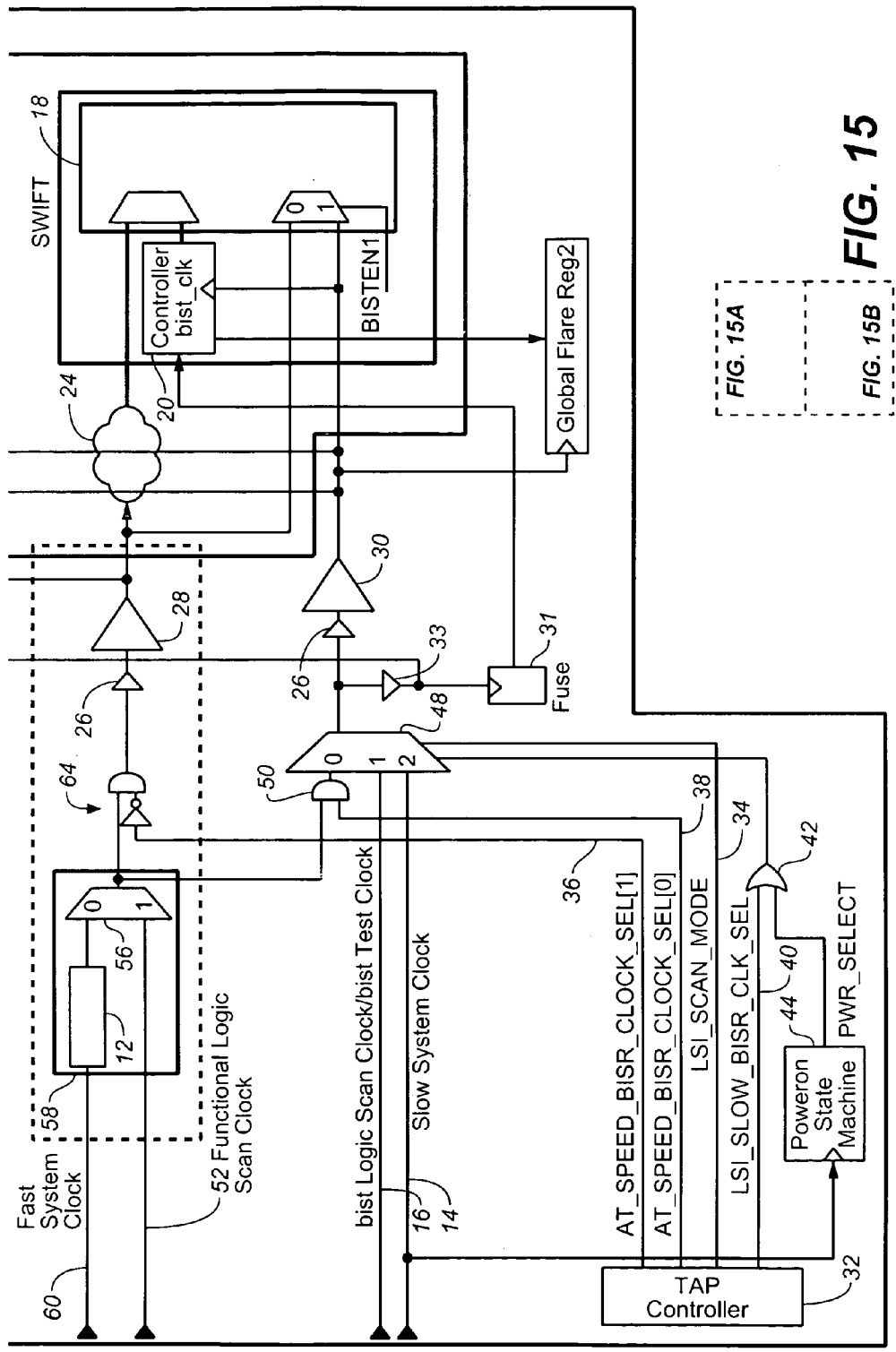
Figure 16A:
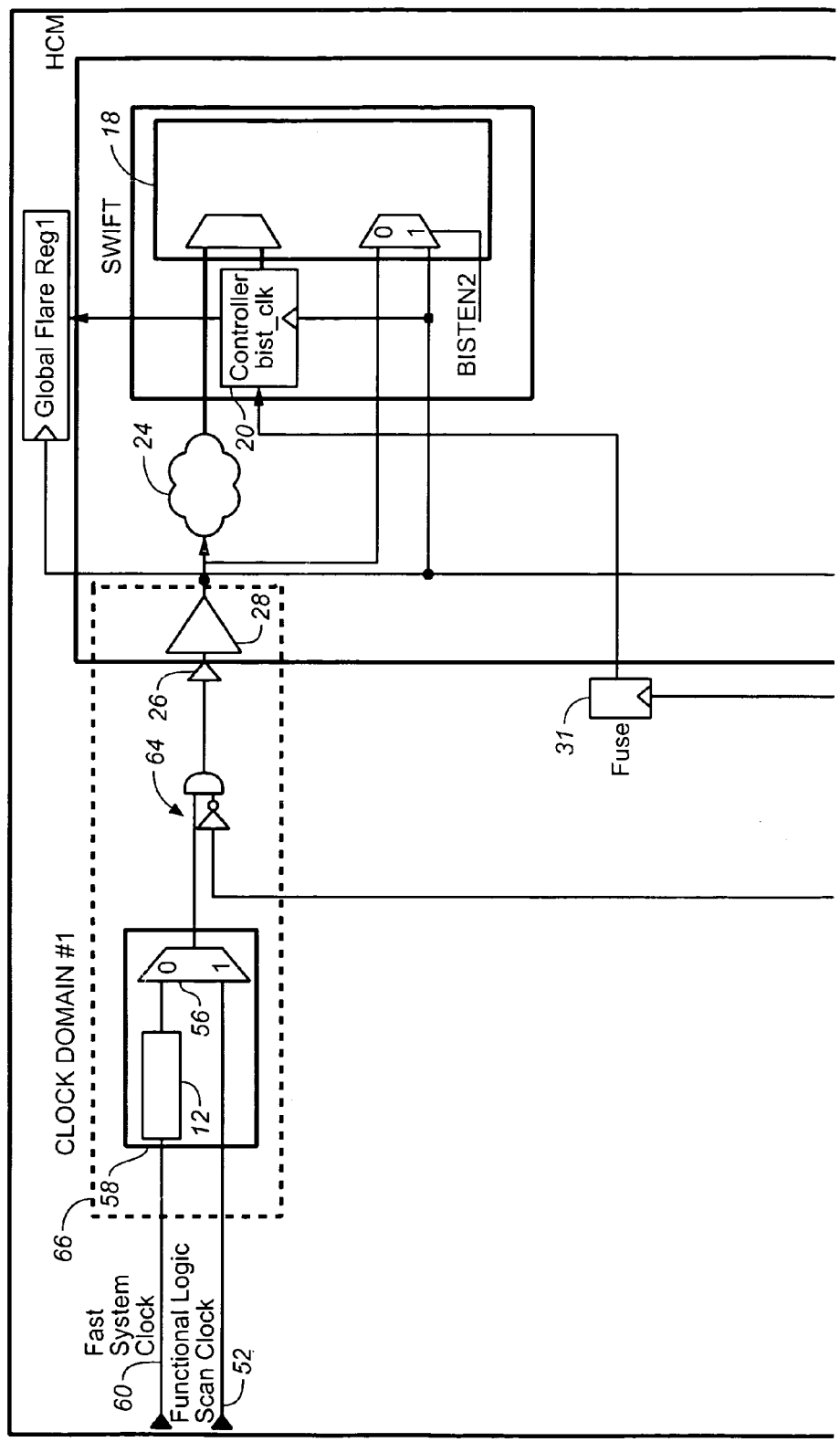
FIG. 16 is a circuit diagram which shows on BIST clock tree being used for all the controllers in the circuit.

FIGS. 14-16 illustrate different variations of the circuits described and depicted herein. FIGS. 14-16 illustrate circuits which are similar to that which is shown in FIG. 1. Hence, like reference numerals are used to identify like parts. FIG. 14 is a circuit diagram which shows a separate BIST clock tree 30 for each memory clock domain for at-speed BIST. In FIG. 14, there would be different pins if controllers 20 communicate with each other through RAM bypass logic.

FIG. 15 is a circuit diagram which shows memories 18 in the same clock domain sharing the same clock trees 30. In FIG. 15, group memories from the same clock domain are driven by the same system clock tree and the same bist clock tree. There is no choice of shutting off one controller clock while switching on the other controller's clock. For scan ATPG, the controllers can communicate with each other as they share the same clock tree.

FIG. 16 is a circuit diagram which shows one BIST clock tree 30 being used for all the controllers 20 in the circuit. FIG. 16 assumes one speed field-bist. For scan, the controllers can communicate with each other as there is only one bist clock.

Figure 17:
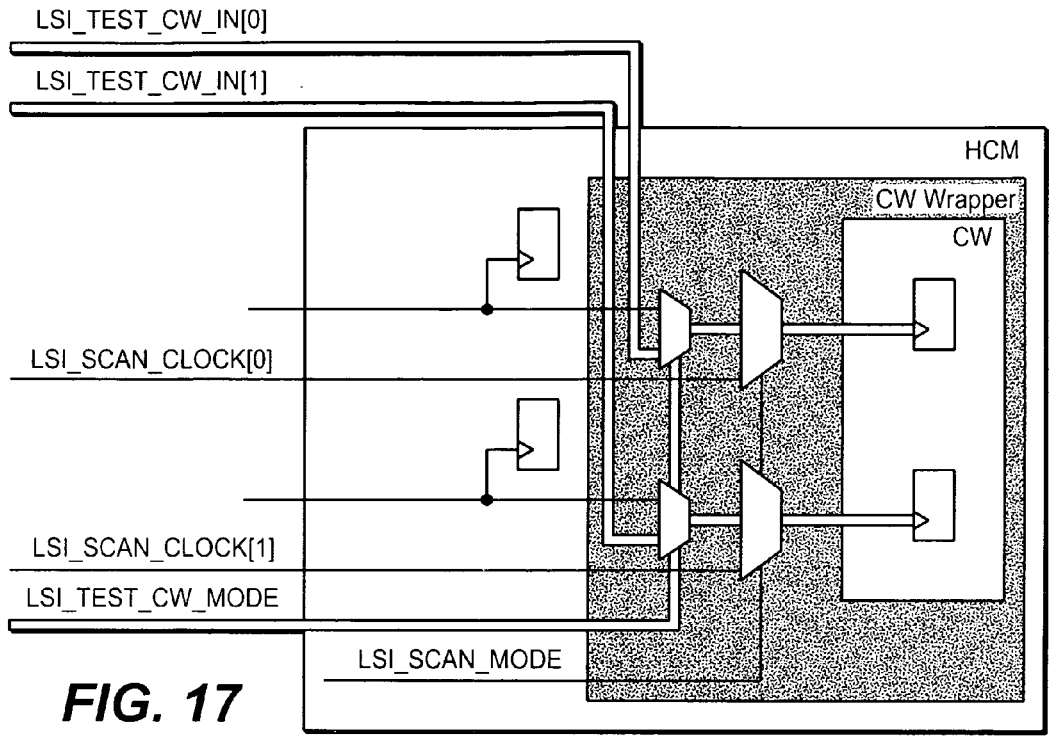
FIGS. 17-20 illustrate other embodiments of the present invention.
Figure 18:
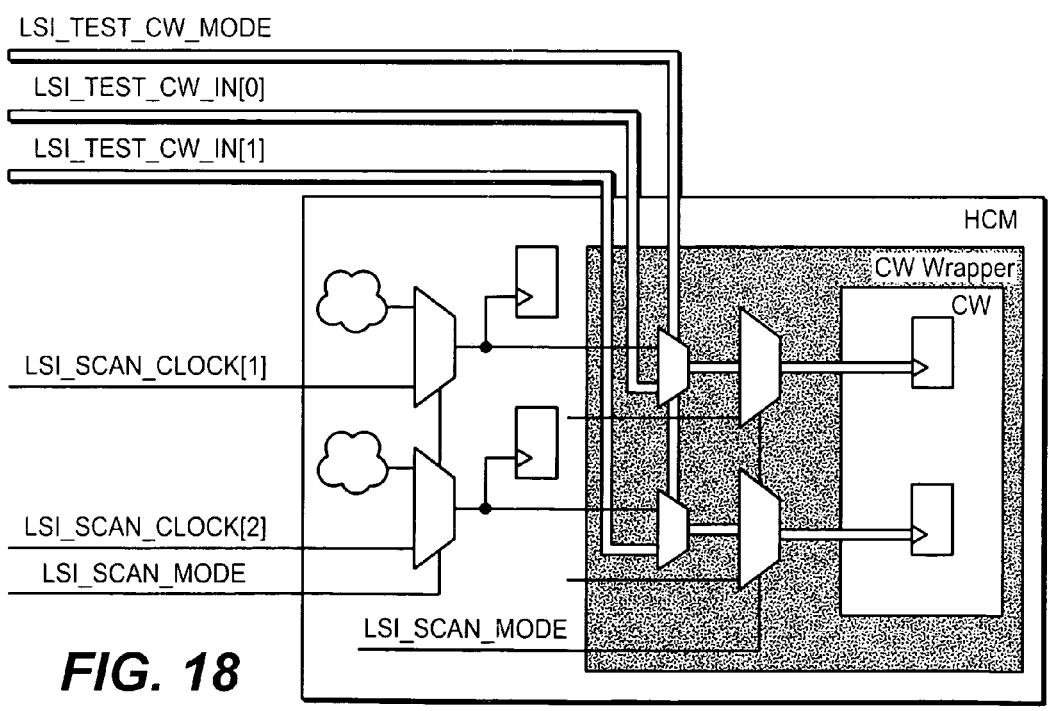
Figure 19:
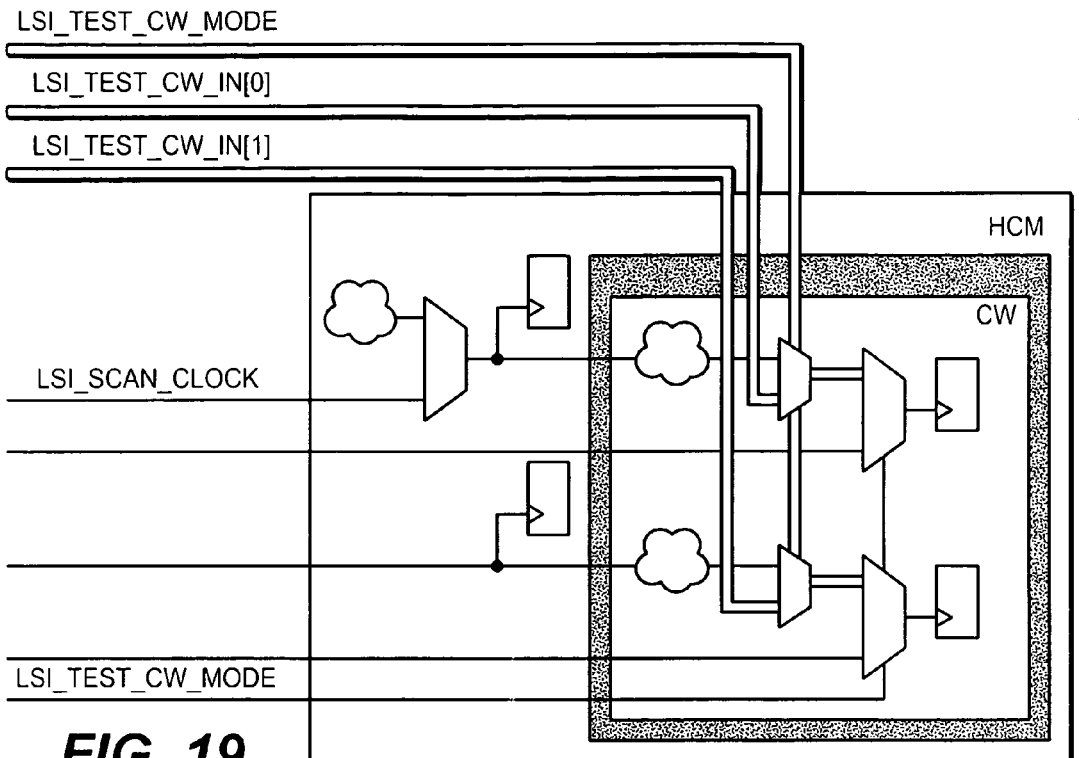
Figure 20:
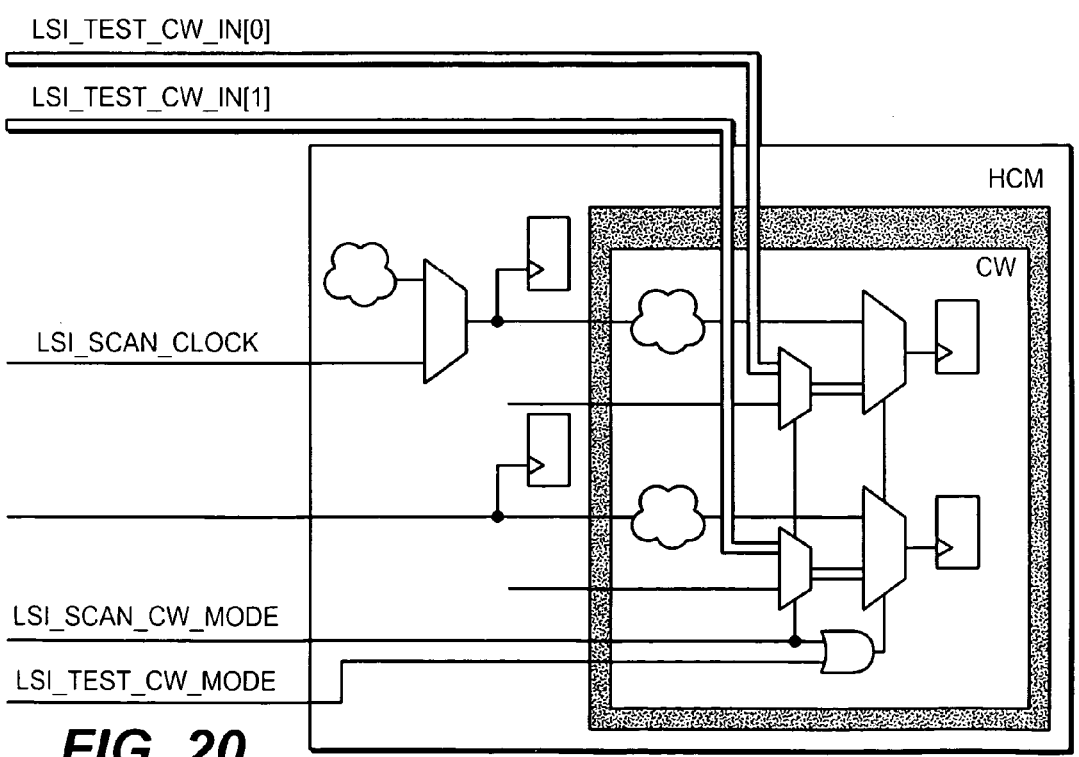

Still other embodiments of the present invention are illustrated in FIGS. 17-20, wherein a clock scheme that drives the core clock pin directly for test bypasses the functional clock pin regardless of the source of clock. In other words, the core clock source is brought directly from the source, bypassing the functional clock. FIG. 17 relates to where the clock is driven by PLL or a dedicated pin, FIG. 18 relates to where the clock is driven by functional logic in the HCM, and FIGS. 19 and 20 relate to where the clocks are driven by logic in the coreware.

While embodiments of the present invention are shown and described, it is envisioned that those skilled in the art may devise various modifications of the present invention without departing from the spirit and scope of the appended claims.

What is claimed is:

1. A test clocking scheme comprising: a memory device; functional logic connected to the memory device; test logic connected to the memory device; a functional clock for driving the functional logic and the memory; and a test clock for driving the test logic and memory, wherein the test clock and the functional clock are separate such that the test logic is driveable by said test clock without said functional logic being driven by said test clock, wherein the scheme is configured such that a value of said test clock does not affect a value of said functional clock, wherein the scheme is configured such that the value of said functional clock does not affect the value of said test clock, wherein the scheme is configured such that the test clock and the functional clock are separate such that said functional logic is driveable by said functional clock without said test logic being driven by said functional clock, wherein the scheme is configured such that the functional clock and test clock can be shut off independently from each other such that the functional logic and memory are driven by said functional clock without said test logic having to be driven by said functional clock, and said test logic and memory are driven by said test clock without said functional logic having to be driven by said test clock.

2. A test clocking scheme as recited in claim 1, further comprising a test clock tree configured to drive said test logic, and a functional clock tree configured to drive said functional logic, wherein said test clock tree and said functional clock tree are separate.

3. A test clocking scheme as recited in claim 1, further comprising a phase locked loop (PLL) which is configured to provide said functional clock.

4. A test clocking scheme as recited in claim 1, further comprising both a built-in self repair (BISR) clock source and a built-in self test (BIST) clock source.

5. A test clocking scheme as recited in claim 1, wherein the functional clock is generated within hybrid circuit modules (HCM).

6. A test clocking scheme as recited in claim 5, further comprising both a built-in self repair (BISR) clock source and a built-in self test (BIST) clock source.

7. A test clocking scheme as recited in claim 1, wherein the functional clock is driven directly from a chip pin.

8. A test clocking scheme as recited in claim 1, further comprising a separate test clock tree for each memory clock domain.

9. A test clocking scheme as recited in claim 1, wherein memories in the same clock domain share the same clock trees.

10. A test clocking scheme as recited in claim 1, wherein one test clock tree is used for all test controllers.

11. A test clocking scheme as recited in claim 1, the test clock drives a core clock pin directly for test and bypasses a functional clock pin.

12. A test clocking scheme as recited in claim 11, further comprising a phase locked loop (PLL) which is configured to provide the test clock.

13. A test clocking scheme as recited in claim 11, wherein the functional clock is driven by functional logic in the hybrid circuit modules (HCM).

14. A test clocking scheme as recited in claim 11, wherein both the functional clock and the test clock are driven by logic in the coreware.

15. A test clocking scheme as recited in claim 1, wherein the test clocking scheme is also configured such that both said test clock and said functional clock can be inactive at the same time, during which neither the test logic nor the functional logic is driven by the test clock or the functional clock, respectively.

* * * * *